(12) United States Patent
Cheng et al.

(10) Patent No.: US 8,218,313 B2
(45) Date of Patent: Jul. 10, 2012

(54) ELECTRONIC DEVICE HOUSING HAVING A MOVABLE FOOT PAD MECHANISM

(75) Inventors: Wen-Chieh Cheng, Taipei Hsien (TW); Chih-Yi Wang, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 223 days.

(21) Appl. No.: 12/836,732

(22) Filed: Jul. 15, 2010

(65) Prior Publication Data
US 2011/0170262 A1    Jul. 14, 2011

(30) Foreign Application Priority Data
Jan. 8, 2010    (TW) .............................. 99100380 A (51) Int. Cl.
*H05K 7/20*    (2006.01)
*H05K 5/00*    (2006.01)
*F16M 11/00*    (2006.01)

(52) U.S. Cl. ............... 361/679.48; 361/679.46; 361/695; 454/184; 248/188.8; 248/188.2

(58) Field of Classification Search ............. 361/679.46, 361/679.48, 695; 454/184
See application file for complete search history.

(56) References Cited

U.S. PATENT DOCUMENTS

| | | | | |
|---|---|---|---|---|
| 5,297,003 A | * | 3/1994 | Nomura et al. | 361/679.12 |
| 5,552,960 A | * | 9/1996 | Nelson et al. | 361/679.54 |
| 6,097,595 A | * | 8/2000 | Cipolla | 361/679.21 |
| 6,181,554 B1 | * | 1/2001 | Cipolla et al. | 361/679.46 |
| 6,496,369 B2 | * | 12/2002 | Nakamura | 361/697 |
| 7,643,277 B2 | * | 1/2010 | Tang | 361/679.15 |
| 7,926,781 B2 | * | 4/2011 | Wang | 248/685 |
| 7,929,292 B2 | * | 4/2011 | Li et al. | 361/679.46 |
| 7,950,611 B2 | * | 5/2011 | Tracy et al. | 248/176.3 |
| 7,990,703 B2 | * | 8/2011 | Tang | 361/679.59 |
| 2002/0012228 A1 | * | 1/2002 | Ozaki et al. | 361/687 |
| 2002/0135978 A1 | * | 9/2002 | Hidesawa | 361/687 |
| 2008/0198505 A1 | * | 8/2008 | Chuang | 360/98.01 |
| 2010/0226088 A1 | * | 9/2010 | Huang | 361/679.48 |

* cited by examiner

*Primary Examiner* — Zachary M Pape
(74) *Attorney, Agent, or Firm* — Whyte Hirschboeck Dudek SC (57) ABSTRACT

An electronic device housing includes a housing body, a movable foot pad mechanism disposed in housing body, a ventilation grille, a fan, and a fan switch connected electrically to the fan. The movable foot pad mechanism includes a foot pad pivoted to a bottom wall of the housing body. The foot pad is turnable pivotally to prop up the housing body so as to increase a space below a bottom of housing body. When the foot pad is being turned pivotally to prop up the housing body, the ventilation grille is moved simultaneously so as to make the space inside the housing body open to the ambient environment, and the fan is activated for heat dissipation, thereby increasing the heat dissipation efficiency of the electronic device housing.

14 Claims, 6 Drawing Sheets

ELECTRONIC DEVICE HOUSING HAVING A MOVABLE FOOT PAD MECHANISM

CROSS-REFERENCE TO RELATED APPLICATION

This application claims priority of Taiwanese Application No. 099100380, filed on Jan. 8, 2010.

BACKGROUND OF THE INVENTION

1. Field of the Invention

The invention relates to a movable foot pad mechanism and an electronic device housing having the movable foot pad mechanism, more particularly to a movable foot pad mechanism capable of enhancing the heat-dissipating effect of an electronic device housing, and the electronic device housing.

2. Description of the Related Art

A conventional notebook computer may be placed on a supporting surface of a desk or on the lap of a seated user for use. However, for a notebook computer with a high operating efficiency, a housing body thereof will become hot after a period of use. When the notebook computer is placed on a desktop for use, if there is not enough space between the housing body and the desktop for dissipation of heat, the housing body is likely to become over-heated. In a worse case, the electronic components within the housing body may be damaged. On the other hand, when the notebook computer is placed on the user's lap, the overheated housing body is likely to cause discomfort to the user's lap due to the heat, even to the extent that the user's lap may get burned.

SUMMARY OF THE INVENTION

Therefore, an object of the present invention is to provide an electronic device housing having a movable foot pad mechanism that can overcome the heat-dissipating problems associated with the prior art. The movable foot pad mechanism is operable and movable to prop the device housing higher upward relative to a supporting surface so as to increase a heat-dissipating space between the device housing and the supporting surface.

Accordingly, an electronic device housing of the present invention includes a housing body and a movable foot pad mechanism disposed in the housing body. The housing body has a bottom wall provided with an opening. The movable foot pad mechanism includes a foot pad, a first spring, and an interfering member. The foot pad is disposed pivotably on the bottom wall and has a foot pad body received in the opening. The foot pad body is movable pivotally between a first direction state and a second direction state within the opening, and protrudes farther downwardly of the bottom wall in the second direction state than in the first direction state to thereby prop the housing body higher upward relative to a supporting surface below. The first spring is connected to the foot pad body and the housing body so as to provide a biasing force for biasing the foot pad body to turn pivotally to the second direction state. The interfering member is disposed operably in the housing body and has an interfering end. The interfering end faces toward the foot pad body and is for interferingly engaging with the foot pad body to thereby limit the foot pad body in the first direction state. When the interfering member is operated to cause the interfering end to move away from the foot pad body, the foot pad body is turned pivotally to the second direction state by virtue of the biasing force of the first spring.

One effect of the present invention resides in that, by operating the interfering member to cause the same to release the foot pad body, the foot pad body can automatically turn pivotally to the second direction state by virtue of the biasing force of the first spring so as to prop the bottom wall higher upward relative to the supporting surface in order to make more room available for heat dissipation.

Furthermore, the bottom wall is further provided with a plurality of first air vents, and the electronic device housing further includes a ventilation grille disposed on the bottom wall, adjacent to the foot pad body, and above the first air vents, and a second spring. The ventilation grille has a plurality of second air vents. The second spring has one end connected to the bottom wall at a position between the opening and the first air vents, and another end connected to the ventilation grille such that the ventilation grille is displaceable resiliently relative to the bottom wall. When the foot pad body is disposed in the first direction state, the ventilation grille is pushed by the foot pad body to enable the second air vents to be staggered relative to the first air vents, and the second spring accumulates a restoring force. When the foot pad body is disposed in the second direction state, the ventilation grille is restored to a state in which the second air vents are registered and fluidly communicated with the first air vents.

Another effect of the present invention resides in that, by virtue of the connection and cooperation between the ventilation grille and the foot pad body, when the housing body is being propped upward, the interior space of the housing body can be simultaneously brought into fluid communication with the ambient environment, whereby the hot air inside the housing body can disperse downward through the ventilation grille and out of the bottom wall. By configuring the foot pad body to push the ventilation grille to cause the second air vents in the ventilation grille to be staggered relative to the first air vents when the foot pad body is disposed in the first direction state, an effect of preventing entry of dust or dirt into the housing body through the bottom wall can be achieved.

Furthermore, the housing body further has a first sidewall extending upwardly from the bottom wall, and the electronic device housing further includes a fan disposed on the ventilation grille, and a fan switch disposed on the first sidewall above the opening, and connected electrically to the fan. When the foot pad body is disposed in the second direction state, the foot pad body abuts against the fan switch to thereby enable activation of the fan. The first spring has one end connected to the first sidewall.

A further effect of the present invention resides in that, by virtue of the arrangement of the fan switch and the foot pad body, when the housing body is propped upward and the interior of the housing body is brought into fluid communication with the ambient environment, the fan can be activated at the same time to cause the hot air within the housing body to be quickly dissipated downwardly through the second air vents in the ventilation grille and through the first air vents in the bottom wall.

Furthermore, the foot pad body has a top face, a bottom face, and a support end and an abutting end facing in opposite directions. The top face has a protruding block disposed adjacent to the abutting end. When the foot pad body is disposed in the first direction state, the top face faces upwardly, the bottom face faces downwardly, the support end faces toward the first sidewall, and the abutting end faces toward the ventilation grille. When the foot pad body is disposed in the second direction state, the top face faces toward the first sidewall with the protruding block abutting against the fan switch, the bottom wall faces toward the ventilation grille, the support end faces downwardly, and the abutting end faces upwardly.

Furthermore, the foot pad further includes two axles extending respectively from two opposite sides of the foot pad body, and the movable foot pad mechanism further includes a plurality of press plates straddling the axles respectively and each having two ends secured to the bottom wall such that the axles are positioned rotatably on the bottom wall. The foot pad body is configured such that a distance from a central axis of the axles to the bottom face is smaller than a distance from the central axis of the axles to the support end. The first spring has one end connected to the foot pad body at a position between the central axis of the axles and the abutting end, thereby generating a torque with respect to the foot pad body to cause the foot pad body to turn pivotally.

Furthermore, the ventilation grille has a plate edge facing toward the foot pad body and formed with a first guiding ramp. The foot pad body abuts against the first guiding ramp when being turned pivotally to the first direction state so as to generate a horizontal pushing force with respect to the ventilation grille, thereby establishing a connective relationship between the ventilation grille and the foot pad body.

Furthermore, the bottom face of the foot pad body is indented to form a second groove extending through the abutting end. A hook-like structure is disposed in the second groove when the foot pad body is disposed in the second direction state. The top face of the foot pad body is indented to form a first groove extending through the support end. Said one end of the first spring that is connected to the foot pad body is disposed in the first groove.

Furthermore, the housing body further includes a plurality of support structures protruding upwardly from the bottom wall. The ventilation grille is disposed among the support structures. Each of the support structures is indented to form a slot for slidable insertion of a plate edge of the ventilation grille thereinto. This not only supports and positions the ventilation grille on the bottom wall but also guides displacement of the ventilation grille.

In summary, in addition to providing the foot pad mechanism to prop up the housing body so as to increase a space below the housing body for heat dissipation, the present invention also utilizes the ventilation grille and the fan switch to cooperate with the foot pad mechanism so that the space within the housing body is more open to the ambient environment for active heat dissipation when the housing body is being propped up so as to enhance the heat dissipating effect of the device housing.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
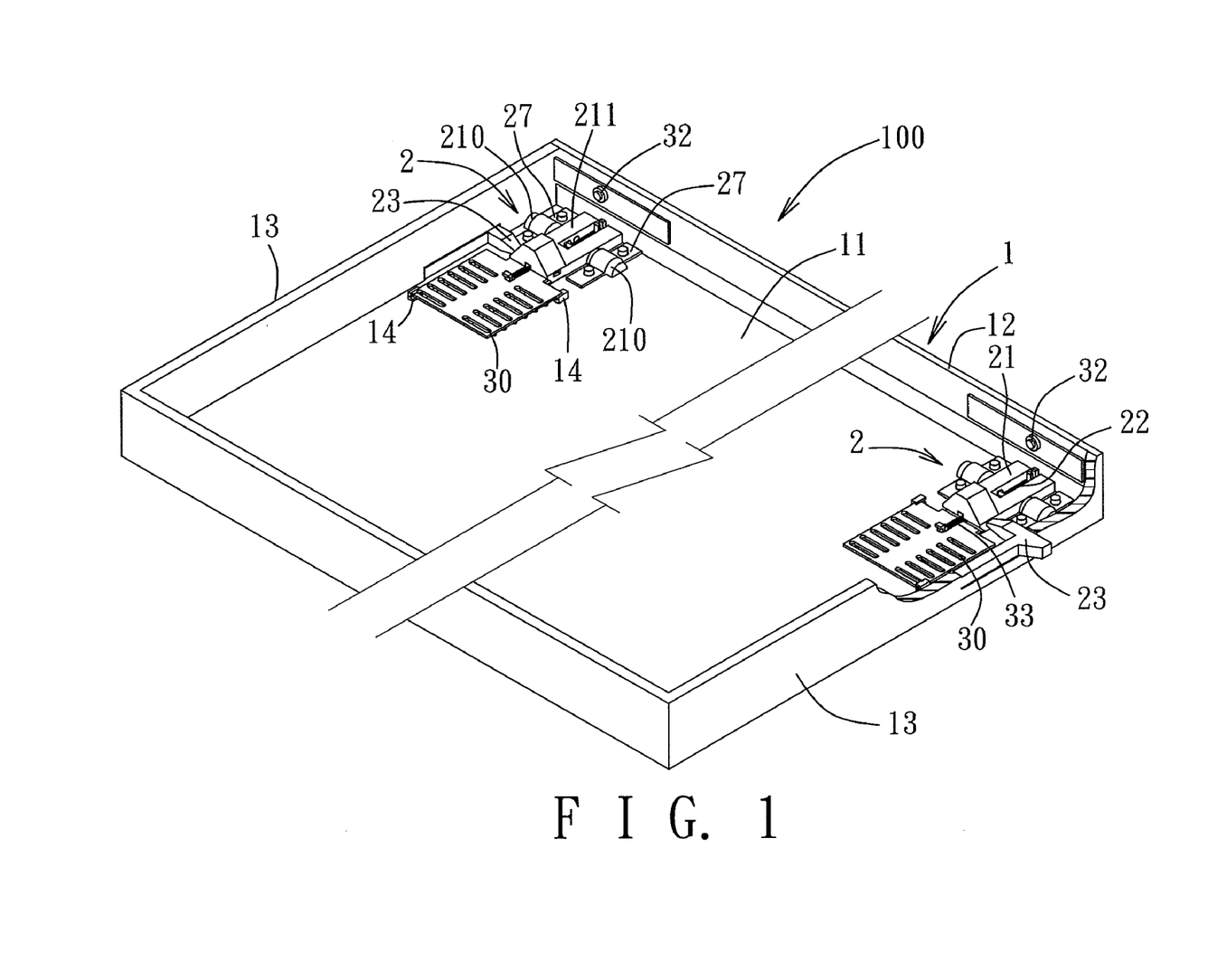
FIG. 1 is a perspective view of the preferred embodiment of an electronic device housing having a movable foot pad mechanism according to the present invention.

Referring to FIG. 1, the preferred embodiment of an electronic device housing 100 according to the present invention is shown to include a housing body 1 and two movable foot pad mechanisms 2 disposed in the housing body 1. The electronic device housing 100 may be a host housing of a notebook computer or a housing of any other electronic device. It should be noted herein that, in the drawings of the preferred embodiment, a top cover of the housing body 1 is omitted in order to better illustrate the structure of the movable foot pad mechanisms 2.

Figure 2:
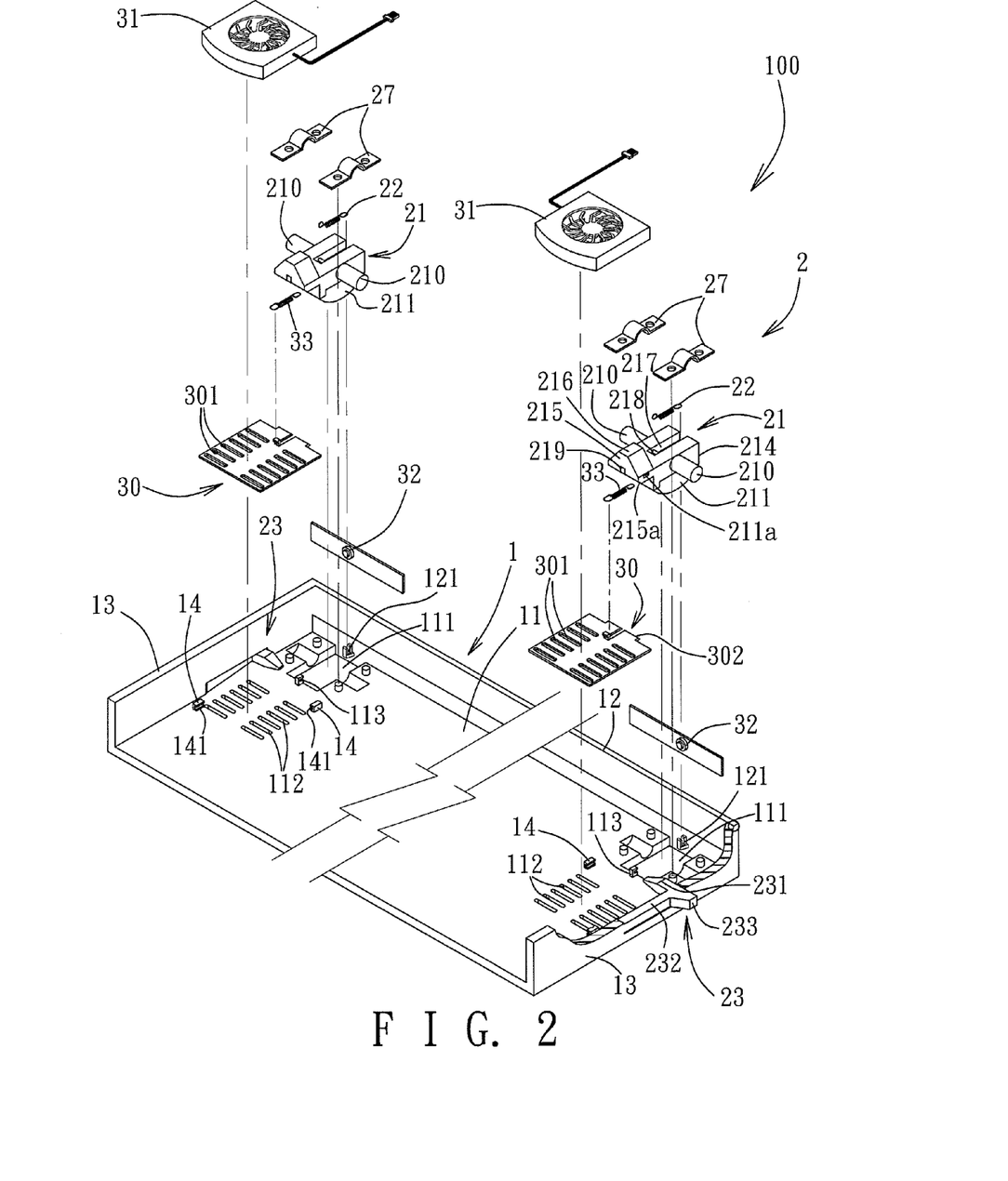
FIG. 2 is an exploded perspective view of the preferred embodiment.

Referring to FIG. 2, the housing body 1 includes a bottom wall 11. The bottom wall 11 is provided with two openings 111. The two openings 111 are disposed respectively at left and right sides of the bottom wall 11. The two movable foot pad mechanisms 2 are disposed respectively at the openings 111 at the left and right sides of the bottom wall 11. Since the two foot pad mechanisms 2 are identical in construction, solely for the purpose of facilitating description, only one of the foot pad mechanisms 2 will be described in detail hereinafter.

Figure 3:
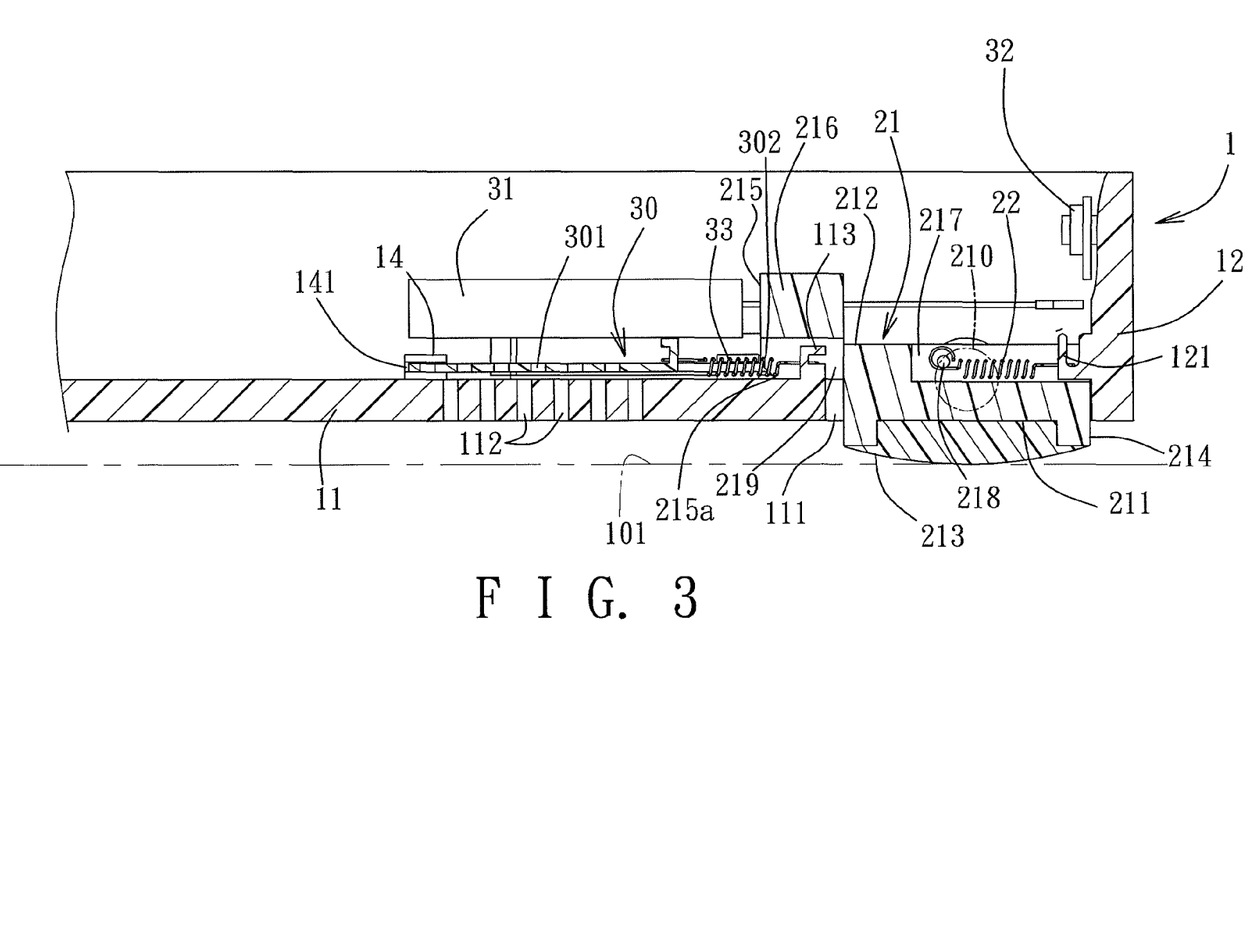
FIG. 3 is a fragmentary sectional view of the preferred embodiment, illustrating a foot pad body in a first direction state.
Figure 4:
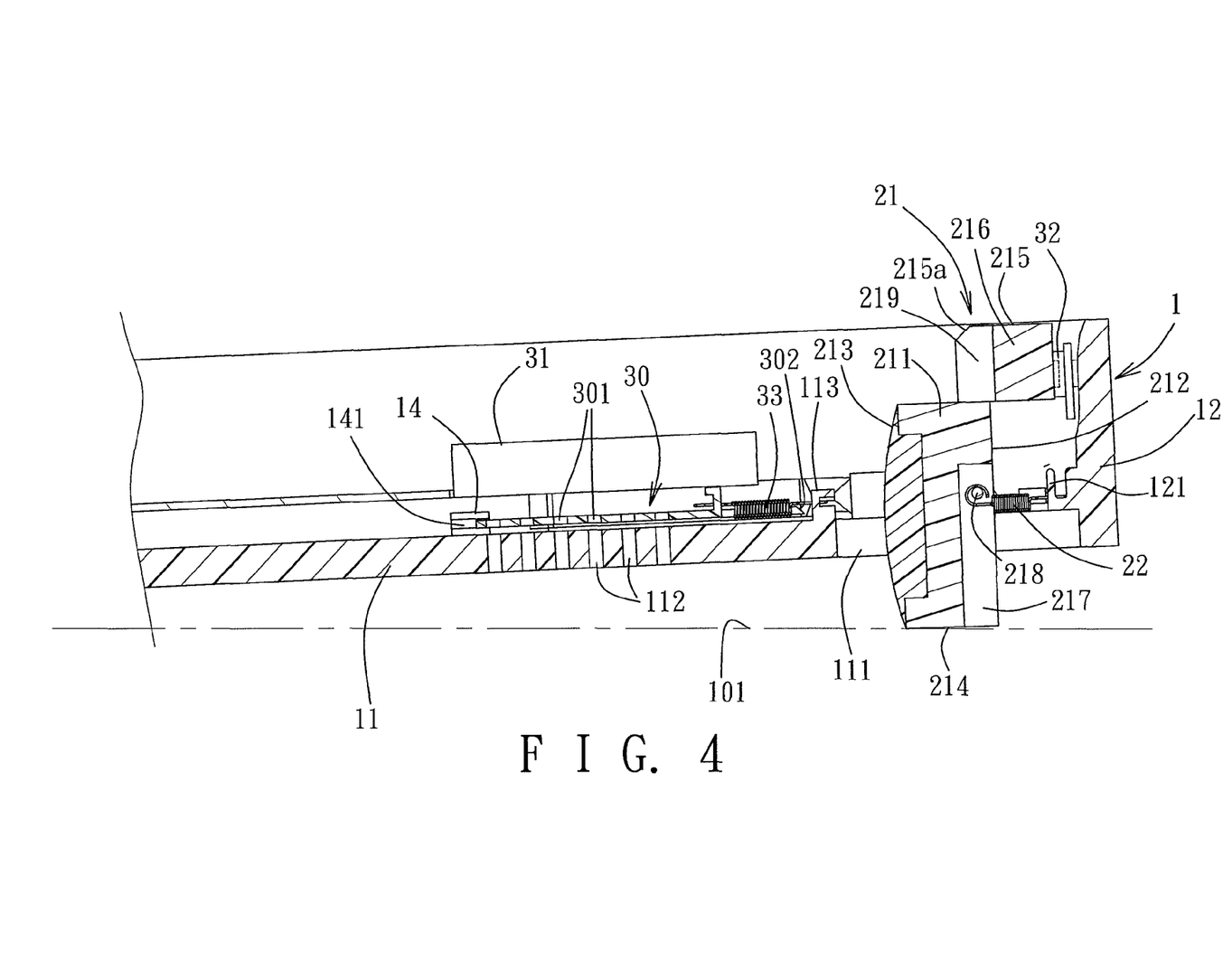
FIG. 4 is a fragmentary sectional view similar to FIG. 3, illustrating the foot pad body in a second direction state.

Referring to FIGS. 2 to 4, each of the movable foot pad mechanisms 2 includes a foot pad 21, a first spring 22, and an interfering member 23. The foot pad 21 is connected pivotably to the bottom wall 11 and has a foot pad body 211 received in the respective opening 111. By virtue of pivotal connection, the foot pad body 211 is turnable pivotally between a first direction state (as shown in FIG. 3) and a second direction state (as shown in FIG. 4) within the respective opening 111. The foot pad body 211 is dimensioned and configured such that the foot pad body 211 protrudes farther downwardly of the bottom wall 11 when turned pivotally to the second direction state than when turned pivotally to the first direction state. Therefore, as shown in FIGS. 3 and 4, when the housing body 1 is placed on a supporting surface 101 and the foot pad body 211 is disposed in the second direction state, the foot pad body 211 can prop the bottom wall 11 higher upward than when the foot pad body 211 is in the first direction state so as to place the bottom wall 11 in a slanting state.

The first spring 22 is connected to the foot pad body 211 and the housing body 1 so as to provide a biasing force for biasing the foot pad body 211 to turn pivotally to the second direction state. In this embodiment, the first spring 22 is an extension spring.

Figure 5:
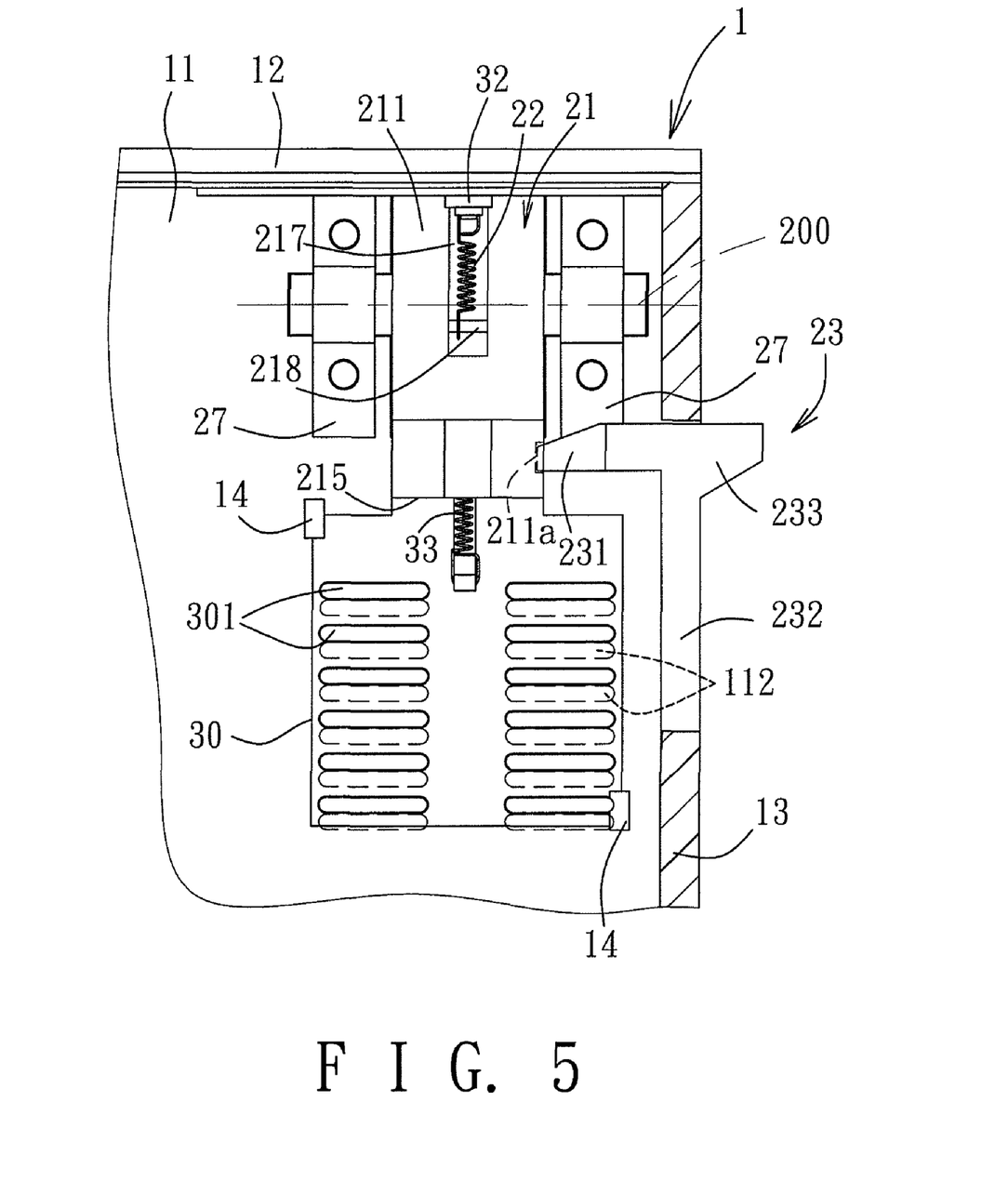
FIG. 5 is a fragmentary top view of the preferred embodiment, showing second air vents in a ventilation grille and first air vents in a bottom wall in a staggered relationship.
Figure 6:
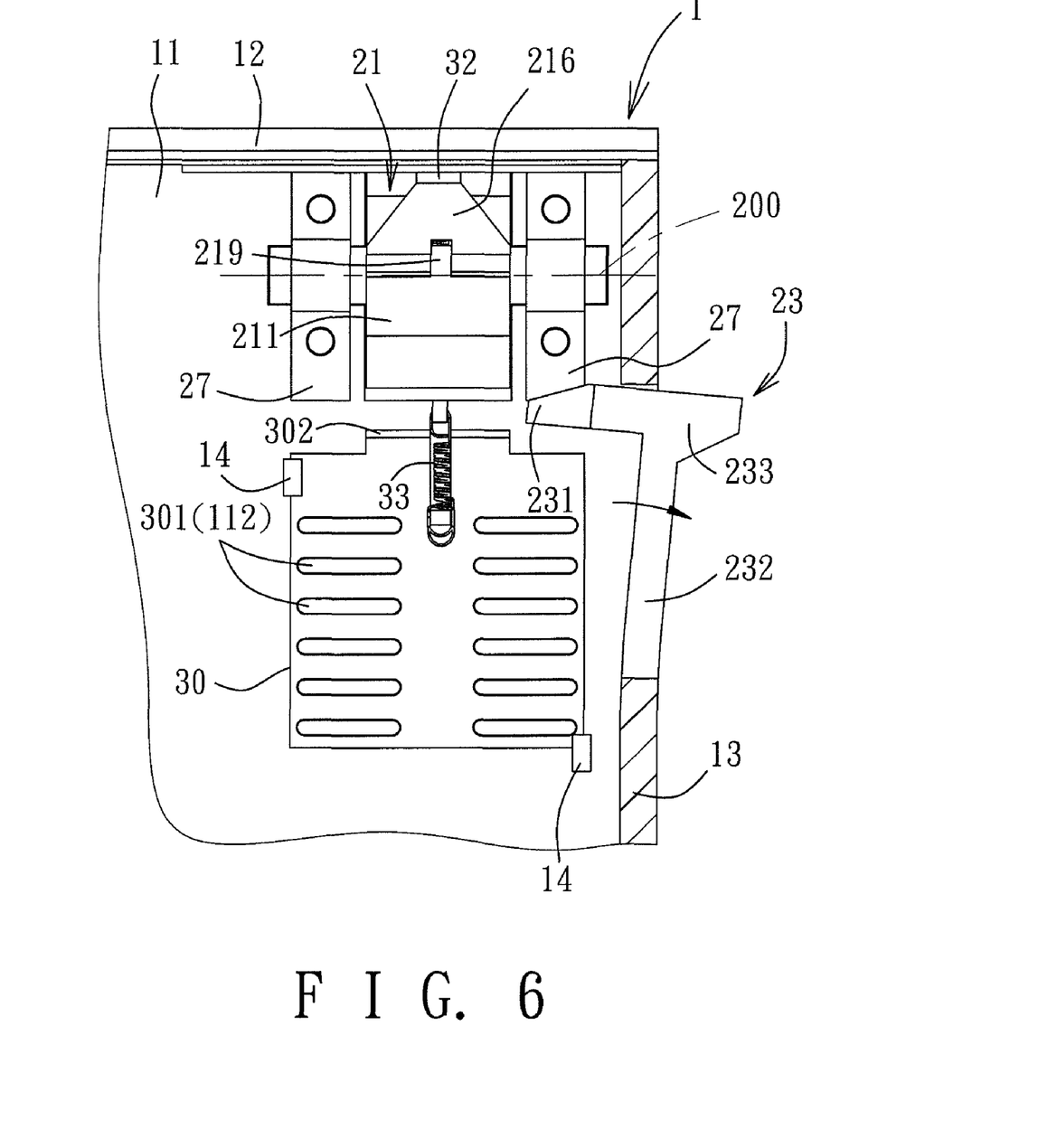
FIG. 6 is a fragmentary top view similar to FIG. 5, illustrating the second air vents in the ventilation grille registered and fluidly communicated with the first air vents in the bottom wall.

Referring to FIGS. 2, 5 and 6, the interfering member 23 is disposed operably in the housing body 1, and has an interfering end 231 facing toward the respective foot pad body 211. By virtue of the interference between the interfering end 231 and the foot pad body 211, the foot pad body 211 can be limited in the first direction state. When the interfering member 23 is operated to move so that the interfering end 231 is moved away from the foot pad body 211, the foot pad body 211 will move pivotally to the second direction state by virtue of the biasing force of the respective first spring 22.

Therefore, it is apparent from the foregoing that one effect of the present invention resides in that, as shown in FIGS. 4 and 6, when more space under the bottom wall 11 of the housing body 1 is needed for heat dissipation, by operating the interfering member 23 to cause the same to release the foot pad body 211, the foot pad body 211 can automatically turn pivotally to the second direction state by virtue of the biasing force of the respective first spring 22 so as to prop the bottom wall 11 higher upward relative to the supporting surface 101 so as to make more room available for heat dissipation.

Furthermore, referring to FIG. 2, in this embodiment, the bottom wall 11 is further provided with a set of first air vents 112 disposed adjacent to a front side of each of the openings 111. The electronic device housing 100 further includes two ventilation grilles 30 and two second springs 33. Each of the ventilation grilles 30 is disposed to cooperate with a respective one of the second springs 33. Referring to FIGS. 3 and 4, each of the ventilation grilles 30 has a plurality of second air vents 301. The ventilation grilles 30 are disposed on the bottom wall 11 adjacent to the foot pad bodies 211 of the foot pads 21 of the foot pad mechanisms 2, respectively, and are located above the two sets of first air vents 112, respectively. Each of the second springs 33 has one end connected to a respective one of the ventilation grilles 30, and another end connected to the bottom wall 11 at a position between the respective one of the openings 111 and the corresponding set of the first air vents 112 such that the ventilation grilles 30 may displace resiliently forward or rearward relative to the bottom wall 11 to permit the second air vents 301 in each of the ventilation grilles 30 and the corresponding set of first air vents 112 to be registered and fluidly communicated with each other or to be staggered from each other. Preferably, the housing body 1 further includes two engaging hook structures 113 protruding upwardly from the bottom wall 11, each of which is disposed between a respective one of the openings 111 and the respective set of the first air vents 112. Each of the engaging hook structures 113 is disposed to secure said another end of a respective one of the second springs 33. Similarly, solely for the purpose of facilitating description, details of only one of the ventilation grilles 30 and components associated therewith will be described hereinafter.

In addition, in this embodiment, the positional relationship between the ventilation grille 30 and the foot pad body 211 is such that when the foot pad body 211 is disposed in the first direction state as shown in FIG. 3, the ventilation grille 30 will be pushed by the foot pad body 211 to displace forward so that the second air vents 301 in the ventilation grille 30 are staggered from the respective set of first air vents 112 in the bottom wall 11, and the second spring 33 at this time accumulates a restoring force, and such that when the foot pad body 211 is disposed in the second direction state as shown in FIG. 4, the foot pad body 211 is moved away from the ventilation grille 30 so that the ventilation grille 30 is released by virtue of the restoring force of the respective second spring 33 to return to the state in which the second air vents 301 therein are registered and are in fluid communication with the respective set of first air vents 112.

It is apparent from the foregoing that another effect of the present invention resides in that, by virtue of the connection and cooperation between the ventilation grille 30 and the foot pad body 211, when the foot pad body 211 is disposed in the second direction state so that a larger space is formed under the bottom wall 11 for heat dissipation, the second air vents 301 in the ventilation grille 30 can be brought into fluid communication with the respective set of the first air vents 112 in the bottom wall 11 at the same time so as to permit fluid communication between the interior of the housing body 1 and the ambient environment, whereby the hot air inside the housing body 1 can disperse downward through the ventilation grille 30 and out of the bottom wall 11. In addition, by configuring the foot pad body 211 to push the ventilation grille 30 to cause the second air vents 301 in the ventilation grille 30 to be staggered relative to the respective set of the first air vents 112 when the foot pad body 211 is disposed in the first direction state, an effect of preventing entry of dust or dirt into the housing body 1 through the bottom wall 111 can be achieved.

Furthermore, referring to FIGS. 2 to 4 once again, in this embodiment, the electronic device housing 100 further includes two fans 31 disposed and secured respectively on the ventilation grilles 30, and two fan switches 32 connected electrically and respectively to the fans 31. In addition, the housing body 1 further includes a first sidewall 12 extending upwardly from a rear edge of the bottom wall 11. Each of the fan switches 32 is a press switch disposed on a front side of the first sidewall 12 and above a respective one of the openings 111. The two fan switches 32 are configured and positioned such that, when the foot pad bodies 211 are moved pivotally to the second direction state, the foot pad bodies 211 will abut against the fan switches 32, respectively, to enable activation of the fans 31.

Therefore, yet another effect of the present invention resides in that, by virtue of the arrangement of the fan switches 32 and the foot pad bodies 211, when the bottom wall 11 is propped up so that the second air vents 301 in each of the ventilation grilles 30 are in fluid communication with the respective set of the first air vents 112 in the bottom wall 11 to permit fluid communication between the interior of the housing body 1 and the ambient environment, the fans 31 can be activated at the same time to cause the hot air within the housing body 1 to be quickly dissipated downwardly through the second air vents 301 in the ventilation grilles 30 and through the first air vents 112 in the bottom wall 11.

Furthermore, referring to FIGS. 2 to 4 once again, in this embodiment, each of the foot pad bodies 211 has a top face 212, a bottom face 213, and a support end 214 and an abutting end 215 that face in opposite directions. A region of the bottom face 213 adjacent to and below the support end 214 is an arcuate face. The top face 212 has an upwardly protruding block 216 disposed adjacent to the abutting end 215. In this embodiment, when the foot pad body 211 is disposed in the first direction state, the support end 214 faces rearwardly toward the first sidewall 12, the abutting end 215 faces forwardly, and the bottom face 213 abuts against the supporting surface 101. When the interfering member 23 is operated so that the interfering end 231 thereof is moved away from the foot pad body 211, since the foot pad body 211 is subjected to the pulling force of the first spring 22, the foot pad body 211 will turn pivotally in a direction in which the support end 214 is moved downwardly while the abutting end 215 is moved upwardly to the second direction state in which the support end 214 faces downwardly and contacts the supporting surface 101 while the abutting end 215 faces upwardly. At this time, the bottom face 213 of the foot pad body 211 faces forwardly, and the top face 212 faces rearwardly toward the first sidewall 12 with the protruding block 216 abutting against the respective fan switch 32 to thereby activate the respective fan 31.

Furthermore, each of the foot pads 21 further includes two axles 210 respectively extending and projecting outward from left and right sides of the foot pad body 211. Each of the movable foot pad mechanisms 2 further includes two press plates 27. The two press plates 27 respectively straddle the two axles 210, and each have two ends secured to the bottom wall 11 such that the two axles 210 are positioned rotatably and respectively at regions at left and right sides of the respective opening 111 in the bottom wall 11. In addition, in this embodiment, each of the foot pad bodies 211 is configured such that a distance from a central axis 200 (see FIG. 5) of the axles 210 to the bottom face 213 is smaller than a distance from the central axis 200 of the axles 210 to the support end 214. Thus, when each of the foot pad bodies 211 is turned pivotally to the second direction state, the bottom wall 11 can be propped upward.

It is additionally noted that, if it is desired to restore the foot pad body 211 to the first direction state, by pushing the support end 214 of the foot pad body 211 rearward directly from a lower side of the bottom wall 11 so that the abutting end 215 is turned pivotally forward and downward to a position where the abutting end 215 is oriented forwardly, and the first spring 22 is stretched, the foot pad body 211 can be restored to the first direction state in which the top face 212 is oriented upwardly while the bottom face 213 is oriented downward. Subsequently, by means of the interfering end 231 of the interfering member 23 that is interferingly engaged with the foot pad body 211, the foot pad body 211 can be once again positioned in the first direction state.

Furthermore, in this embodiment, a plate edge of the ventilation grille 30 that faces toward the foot pad body 211 may be formed with a first guiding ramp 302 so that, during the process when the abutting end 215 of the foot pad body 211 is turned pivotally downward to be restored to the first direction state, by means of the abutting end 215 that displaces downwardly along and presses against the first guiding ramp 302, a horizontal pushing force can be generated and imparted to the ventilation grille 30 to push the ventilation grille 30 forward so that the second air vents 301 in the ventilation grille 30 are once again staggered relative to the respective set of the first air vents 112 in the bottom wall 11.

Preferably, a bottom edge of the abutting end 215 of the foot pad body 211 is formed with a second guiding ramp (215a) having an oblique angle complementary to that of the first guiding ramp 302 so that, when the foot pad body 211 is disposed in the first direction state, the first guiding ramp 302 faces toward and mates with the second guiding ramp (215a).

Furthermore, referring to FIGS. 2, 3 and 5, the top face 212 of the foot pad body 211 is formed with a first groove 217 that extends rearwardly through the support end 214. One end of the first spring 22 that is connected to the foot pad body 211 is disposed in the first groove 217. In this embodiment, the first groove 217 extends forwardly to a length that exceeds the central axis 200 about which the foot pad body 211 can be turned pivotally relative to the bottom wall 11 to be interposed between the abutting end 215 and the central axis 200, so that the pulling force of the first spring 22 can generate a torque relative to the foot pad body 211. Furthermore, a transverse rod 218 is formed at a front end of the first groove 217 that extends beyond the central axis 200 for hooking by said one end of the first spring 22. The other end of the first spring 22 is hooked and connected to the front side of the first sidewall 12. Preferably, at each opening 111, a hook-like structure 121 is formed on and projects from the front side of the first sidewall 12 for hooking by said other end of the first spring 22.

Moreover, the bottom face 213 of the foot pad body 211 is indented to form a second groove 219 extending through the abutting end 215 at a position adjacent to the abutting end 215, so that, when the foot pad body 211 is disposed in the first direction state, the end of the second spring 33 that is connected to the bottom wall 11 is disposed in the second groove 219. In other words, the second groove 219 is configured to prevent the second spring 33 from interfering with movement of the foot pad body 211.

Moreover, referring once again to FIGS. 2, 3 and 4, the housing body 1 further includes a plurality of support structures 14 protruding upwardly from the bottom wall 11. The support structures 14 are disposed respectively at left and right sides of each set of the first air vents 112 such that each of the ventilation grilles 30 is disposed between the support structures 14 at the respective set of the first air vents 112. Each of the support structures 14 is laterally indented to form a slot 141 for slidable insertion of part of the plate edge of the respective ventilation grille 30 thereinto. Thus, the support structures 14 not only provide support for the ventilation grilles 30 but also serve to guide forward and rearward displacement of the ventilation grilles 30.

Furthermore, referring to FIGS. 2, 5 and 6, the housing body 1 further includes two second sidewalls 13 extending respectively from left and right lateral edges of the bottom wall 11 and connected to the first sidewall 12. The interfering members 23 of the movable foot pad mechanisms 2 are disposed respectively on the second sidewalls 13. Each of the interfering members 23 further includes a resilient section 232 and an operating end 233 connected to the resilient section 232. In this embodiment, each of the resilient sections 232 has one end integrally formed with and connected to the respective second sidewall 13. The interfering end 231 and the operating end 233 are both connected to the other end of the resilient section 232 so as to cooperatively form a generally T-shaped structure. In other words, the interfering end 231 protrudes inwardly of the respective second sidewall 13 and faces toward the respective foot pad body 211, whereas the operating end 233 protrudes outwardly of the respective second sidewall 13 and is accessible externally. In operation, a force is applied to the operating end 233 to pull the interfering member 23 outwardly so that the resilient section 232 undergoes a slight elastic deformation and can thus move away from the foot pad body 211 to thereby permit the foot pad body 211 to be turned pivotally to the second direction state. Preferably, one side of the foot pad body 211 that faces toward the second sidewall 13 may be indented to form an engaging groove (211a) into which the interfering end 231 extends so as to achieve an interference fit with the foot pad body 211.

It should be noted herein that although the movable foot pad mechanisms 2 and the ventilation grilles 30, the fans 31, and the fan switches 32 in cooperation therewith are exemplified to be two in number, with one at each side of the housing body 1, there may be provided only one foot pad mechanism 2, one ventilation grille 30, one fan 31, and one fan switch 32 by employing a different spatial arrangement for the housing body 1 or by adopting other mechanical design.

In summary, by virtue of the arrangement of the pivotally movable foot pad mechanisms 2 of this invention, the housing body 1 can be propped upward when heat dissipation is needed so as to increase the space below the housing body 1 for heat dissipation. In addition, with the arrangement of the ventilation grilles 30 that move in association with the respective foot pad bodies 211, and the fan switches 32 that are disposed relative to the respective foot pad bodies 211, the space within the housing body 1 is more open to the ambient environment when the housing body 1 is propped upward, and active heat dissipation can be effected on the housing body 1 so as to enhance the heat dissipating effect of the device housing 100.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An electronic device housing, comprising: a housing body having a bottom wall provided with an opening; and a movable foot pad mechanism including a foot pad disposed pivotably on said bottom wall and having a foot pad body received in said opening, said foot pad body being movable pivotally between a first direction state and a second direction state within said opening, said foot pad body protruding farther downwardly of said bottom wall in the second direction state than in the first direction state, a first spring connected to said foot pad body and said housing body so as to provide a biasing force for biasing said foot pad body to turn pivotally to the second direction state, and an interfering member disposed operably in said housing body and having an interfering end, said interfering end facing toward said foot pad body and being provided for interferingly engaging with said foot pad body to thereby limit said foot pad body in the first direction state, said foot pad body being turned pivotally to the second direction state by virtue of the biasing force of said first spring when said interfering member is operated to cause said interfering end to move away from said foot pad body wherein said bottom wall is further provided with a plurality of first air vents, said electronic device housing further comprising a ventilation grille disposed on said bottom wall, adjacent to said foot pad body, and above said first air vents, and a second spring, said ventilation grille having a plurality of second air vents, said second spring having one end connected to said bottom wall at a position between said opening and said first air vents, and another end connected to said ventilation grille such that said ventilation grille is displaceable resiliently relative to said bottom wall, said ventilation grille being pushed by said foot pad body to enable said second air vents to be staggered relative to said first air vents and said second spring accumulating a restoring force when said foot pad body is disposed in the first direction state, said ventilation grille being restored to a state in which said second air vents are registered and fluidly communicated with said first air vents when said foot pad body is disposed in the second direction state.

2. The electronic device housing of claim 1, wherein said housing body further has a first sidewall extending upwardly from said bottom wall, said electronic device housing further comprising a fan disposed on said ventilation grille, and a fan switch disposed on said first sidewall and above said opening, and connected electrically to said fan, said foot pad body abutting against said fan switch to thereby enable activation of said fan when said foot pad body is disposed in the second direction state, said first spring having one end connected to said first sidewall.

3. The electronic device housing of claim 2, wherein said foot pad body has a top face, a bottom face, and a support end and an abutting end facing in opposite directions, said top face having a protruding block disposed adjacent to said abutting end, said top face facing upwardly, said bottom face facing downwardly, said support end facing toward said first sidewall, and said abutting end facing toward said ventilation grille when said foot pad body is disposed in the first direction state, said top face facing toward said first sidewall with said protruding block abutting against said fan switch, said bottom face facing toward said ventilation grille, said support end facing downwardly, and said abutting end facing upwardly when said foot pad body is disposed in the second direction state.

4. The electronic device housing of claim 2, wherein said housing body further has a second sidewall extending upwardly from said bottom wall and connected to said first sidewall, said interfering member being disposed on said second sidewall, said foot pad body having one side facing toward said second sidewall and indented to form an engaging groove for extension of said interfering end thereinto to be thereby interferingly engaged with said foot pad body.

5. The electronic device housing of claim 3, wherein said foot pad further includes two axles extending respectively from two opposite sides of said foot pad body, said movable foot pad mechanism further including a plurality of press plates straddling said axles respectively and each having two ends secured to said bottom wall such that said axles are positioned rotatably on said bottom wall, said foot pad body being configured such that a distance from a central axis of said axles to said bottom face is smaller than a distance from said central axis of said axles to said support end, said first spring having one end connected to said foot pad body at a position between said central axis of said axles and said abutting end.

6. The electronic device housing of claim 5, wherein said first sidewall has one side facing toward said opening and formed with a hook-like structure projecting therefrom for hooking and securing by the other end of said first spring.

7. The electronic device housing of claim 5, wherein said top face of said foot pad body is indented to form a first groove extending through said support end, said one end of said first spring that is connected to said foot pad body being disposed in said first groove.

8. The electronic device housing of claim 3, wherein said ventilation grille has a plate edge facing toward said foot pad body and formed with a first guiding ramp, said foot pad body abutting against said first guiding ramp when being turned pivotally to the first direction state so as to generate a horizontal pushing force with respect to said ventilation grille.

9. The electronic device housing of claim 8, wherein said housing body further has a second sidewall extending upwardly from said bottom wall and connected to said first sidewall, said interfering member being disposed on said second sidewall, said foot pad body having one side facing toward said second sidewall and indented to form an engaging groove for extension of said interfering end thereinto to be thereby interferingly engaged with said foot pad body.

10. The electronic device housing of claim 9, wherein said interfering member further has a resilient section and an operating end, said resilient section having one end connected to said second sidewall, said interfering end and said operating end being connected to the other end of said resilient section, said operating end protruding outwardly of said second sidewall in a direction opposite to said interfering end.

11. The electronic device housing of claim 3, wherein said housing body further includes a hook-like structure protruding from said bottom wall and disposed between said opening and said first air vents, said second spring having one end connected to said ventilation grille, and another end connected to said hook-like structure, said ventilation grille being displaceable resiliently by means of said second spring.

12. The electronic device housing of claim 11, wherein said bottom face of said foot pad body is indented to form a second groove extending through said abutting end, said hook-like structure being disposed in said second groove when said foot pad body is disposed in the second direction state.

13. The electronic device housing of claim 3, wherein said housing body further includes a plurality of support structures protruding upwardly from said bottom wall, said ventilation grille being disposed among said support structures, each of said support structures being indented to form a slot for slidable insertion of a plate edge of said ventilation grille thereinto.

14. The electronic device housing of claim 4, wherein said interfering member further has a resilient section and an operating end, said resilient section having one end connected to said second sidewall, said interfering end and said operating end being connected to the other end of said resilient section, said operating end protruding outwardly of said second sidewall in a direction opposite to said interfering end.

* * * * *